United States Patent
Shen et al.

(10) Patent No.: US 10,930,637 B2
(45) Date of Patent: Feb. 23, 2021

(54) TRANSIENT VOLTAGE SUPPRESSOR

(71) Applicant: AMAZING MICROELECTRONIC CORP., New Taipei (TW)

(72) Inventors: Yu-Shu Shen, Chiayi County (TW); Mei-Lian Fan, Hsinchu County (TW)

(73) Assignee: Amazing Microelectronic Corp., New Taipei (TW)

( * ) Notice: Subject to any disclaimer, the term of this patent is extended or adjusted under 35 U.S.C. 154(b) by 314 days.

(21) Appl. No.: 16/123,110

(22) Filed: Sep. 6, 2018

(65) Prior Publication Data
US 2020/0083211 A1  Mar. 12, 2020

(51) Int. Cl.
H01L 27/02 (2006.01)
H01L 29/06 (2006.01)

(52) U.S. Cl.
CPC ...... H01L 27/0248 (2013.01); H01L 29/0646 (2013.01); H01L 29/0692 (2013.01)

(58) Field of Classification Search
CPC ............. H01L 27/0248; H01L 29/0646; H01L 29/0692
See application file for complete search history.

(56) References Cited

U.S. PATENT DOCUMENTS

| | | | |
|---|---|---|---|
| 5,880,511 A | 3/1999 | Yu et al. | |
| 7,538,395 B2 | 5/2009 | Keena et al. | |
| 8,263,481 B2 | 9/2012 | Schmenn et al. | |
| 9,515,177 B2 * | 12/2016 | Schmenn | H01L 27/0262 |
| 9,583,586 B1 * | 2/2017 | Shi | H01L 29/7424 |
| 9,793,256 B2 * | 10/2017 | Bobde | H01L 27/0255 |
| 9,865,584 B1 | 1/2018 | Lin et al. | |
| 9,881,914 B2 | 1/2018 | Sorgeloos et al. | |
| 2013/0001694 A1 * | 1/2013 | Guan | H01L 27/0248 257/355 |

(Continued)

FOREIGN PATENT DOCUMENTS

CN  105990320 A  10/2016
CN  106449633 A  2/2017
(Continued)

OTHER PUBLICATIONS

Examination Report for Foreign Patent Application No. 201811245838.1 dated Sep. 17, 2020.

*Primary Examiner* — Scott Bauer
(74) *Attorney, Agent, or Firm* — Rosenberg, Klein & Lee

(57) ABSTRACT

A transient voltage suppressor is provided, comprising a heavily doped substrate connected to a first node, a first doped layer formed on the heavily doped substrate, a second doped layer formed on the first doped layer, a first heavily doped region and a second heavily doped region formed in the second doped layer and coupled to a second node, and a plurality of trenches arranged in the heavily doped substrate, having a depth not less than that of the first doped layer for electrical isolation. The heavily doped substrate, the second doped layer, and the second heavily doped region belong to a first conductivity type. The first doped layer and the first heavily doped region belong to a second conductivity type. By employing the proposed present invention, pn junctions of the transient voltage suppressor can be controlled beneath the surface, thereby reducing the junction capacitance effectively.

10 Claims, 8 Drawing Sheets

(56) References Cited

U.S. PATENT DOCUMENTS

| | | | |
|---|---|---|---|
| 2017/0084601 A1* | 3/2017 | Yao | H01L 29/866 |
| 2017/0345811 A1* | 11/2017 | Yin | H01L 27/0259 |
| 2018/0047717 A1 | 2/2018 | Wang et al. | |

FOREIGN PATENT DOCUMENTS

| | | |
|---|---|---|
| CN | 106449634 A | 2/2017 |
| CN | 108198811 A | 6/2018 |

* cited by examiner

TRANSIENT VOLTAGE SUPPRESSOR

BACKGROUND OF THE INVENTION

Field of the Invention

The present invention relates to a transient voltage suppressor, and more particularly to a transient voltage suppressor structure which has its junction buried inside so as to reduce the input capacitance.

Description of the Prior Art

With rapid development of today's technology, integrated circuits have been widely applied in electronic devices. However, electrostatic discharge, ESD hereinafter, may occur everywhere during the phases of testing, assembly, installation, operation, etc., and cause damage to integrated circuits (ICs). Electro Static discharge (ESD) is a phenomenon that releases and transfers charges between integrated circuit chips and external objects. Due to a large amount of charges being released in a short time, the energy from ESD is much higher than the bearing capacity of the chip, which may result in a temporary functional failure or even a permanent damage to the chip. During the process for manufacturing a chip, a wrist strap or an anti-static clothing can be used to reduce the damage from ESD. The chip having been manufactured is easily affected by ESD events between the chip and the external objects when the chip is used in various different environments. Therefore, an ESD protection device is provided in the chip to offer an electrostatic discharge path to protect the chip effectively, so that the reliability and service life of the integrated circuit chip is improved.

FIG. 1 shows a conventional ESD protection to a core circuit. As shown in FIG. 1, ESD (electro Static Discharge) protector 1 is one of the major necessities in the field of integrated circuits for preventing the device to be protected 2 from an ESD event, and has been well known by person skilled in the art. The device to be protected 2 such as core circuits, are prone to damages caused by the ESD event. In a conventional technical field, transient voltage suppressors (TVS) are usually used to conduct an ESD protection. An US patent US2018/0047717 disclosed an ESD protection device and method for manufacturing the same, in which a PSG (phospho-silicate-glass, PSG) layer is configured to be at a surface of the device such that out diffusion of the dopants dramatically occurs at the interface. Under such a condition, it is believed that the junction capacitance will be significantly increased due to this out diffusion phenomenon generating at the surface, thereby degrading the efficiency of the device.

Therefore, on account of above, to overcome the above-mentioned problem, it should be obvious that there is indeed an urgent need for the professionals in the field for a new transient voltage suppressor structure to be developed that can effectively solve those above mentioned problem occurring in the prior design.

SUMMARY OF THE INVENTION

In order to overcome the above-mentioned disadvantages, one major objective in accordance with the present invention is provided for a novel transient voltage suppressor. By employing the transient voltage suppressor of the present invention, pn junctions of the transient voltage suppressor structure can be controlled to be beneath the surface such that the junction capacitance thereof can be effectively reduced, and efficiency of the transient voltage suppressor structure is well maintained.

For achieving the above mentioned objectives, the present invention provides a transient voltage suppressor, which comprises a heavily doped substrate of a first conductivity type, a first doped layer of a second conductivity type, a second doped layer of the first conductivity type, a first heavily doped region of the second conductivity type, a second heavily doped region of the first conductivity type and a plurality of trenches arranged in the heavily doped substrate.

The heavily doped substrate is connected to a first node. The first doped layer is formed on the heavily doped substrate, and the second doped layer is formed on the first doped layer. The first heavily doped region and the second heavily doped region are formed in the second doped layer and coupled to a second node in common. The plurality of trenches are arranged in the heavily doped substrate, having a depth not less than that of the first doped layer, wherein at least one of the plurality of trenches is disposed between the first heavily doped region and the second heavily doped region for electrical isolation.

According to one embodiment of the present invention, when the first conductivity type is N type, the second conductivity type is P type, and the first node and the second node are coupled to an I/O pin and ground, respectively.

In such an embodiment, the first doped layer of the second conductivity type is a P type epitaxial layer. And, the second doped layer of the first conductivity type can be an N type epitaxial layer, or an N type lightly doped well.

When the second doped layer of the first conductivity type is an N type lightly doped well, the N type lightly doped well in which the first heavily doped region is formed can be alternatively removed such that the first heavily doped region can be formed directly in the first doped layer (i.e. the P type epitaxial layer).

According to another embodiment of the present invention, when the first conductivity type is P type, the second conductivity type is N type, and the first node and the second node are coupled to ground and an I/O pin, respectively.

In such an embodiment, the first doped layer of the second conductivity type is an N type epitaxial layer. And, the second doped layer of the first conductivity type can be a P type epitaxial layer, or a P type lightly doped well.

When the second doped layer of the first conductivity type is a P type lightly doped well, the P type lightly doped well in which the first heavily doped region is formed can be alternatively removed such that the first heavily doped region can be formed directly in the first doped layer (i.e. the N type epitaxial layer).

As a result, it is apparent that the present invention discloses a transient voltage suppressor structure, and more particularly to a transient voltage suppressor structure having its junction buried inside. Therefore, by employing such arrangements of the proposed present invention, pn junctions of the transient voltage suppressor structure can be well controlled to be beneath the surface, thereby solving the conventional issues generating in the prior arts as discussed earlier. Moreover, it is believed that the present invention accordingly is advantageous of effectively reducing the junction capacitance as well.

These and other objectives of the present invention will become obvious to those of ordinary skill in the art after reading the following detailed description of preferred embodiments.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
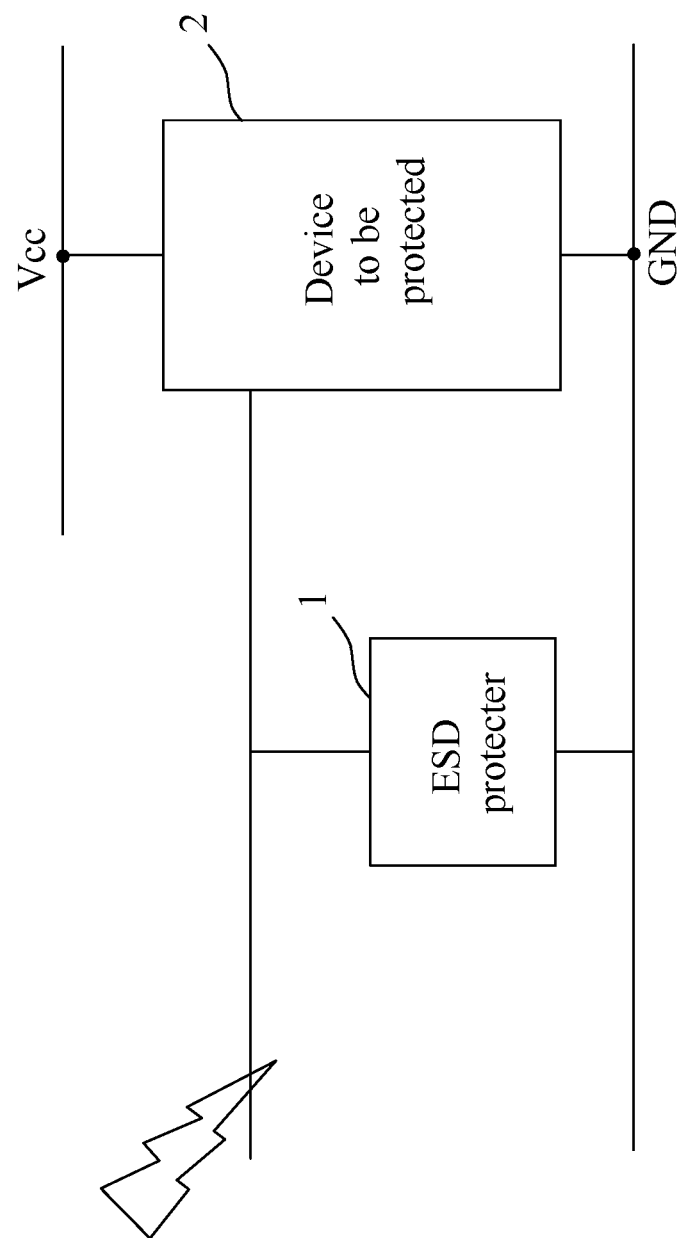
FIG. 1 shows a conventional system level ESD protection scheme in prior arts.

Reference will now be made in detail to the preferred embodiments of the present invention, examples of which are illustrated in the accompanying drawings. Wherever possible, the same reference numbers are used in the drawings and the description to refer to the same or like parts.

The embodiments described below are illustrated to demonstrate the technical contents and characteristics of the present invention and to enable the persons skilled in the art to understand, make, and use the present invention. However, it shall be noticed that, it is not intended to limit the scope of the present invention. Therefore, any equivalent modification or variation according to the spirit of the present invention is to be also included within the scope of the present invention.

Figure 2:
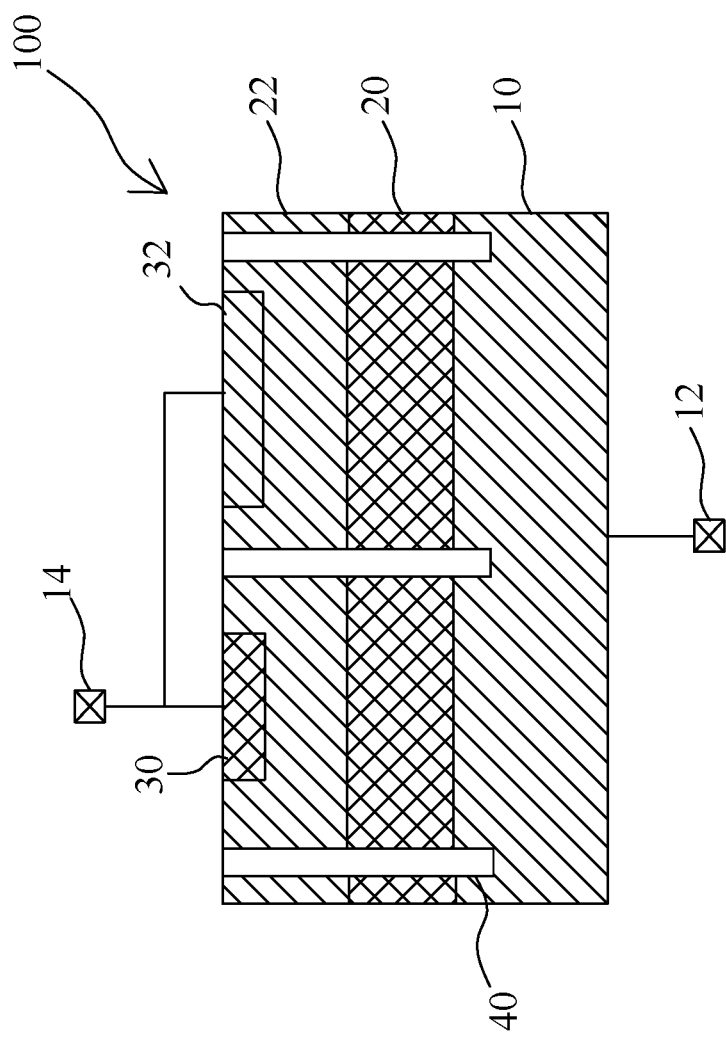
FIG. 2 shows a block diagram of a transient voltage suppressor structure in accordance with an embodiment of the present invention.

The present invention discloses a transient voltage suppressor. Please refer to FIG. 2, which shows a block diagram of a transient voltage suppressor structure in accordance with an embodiment of the present invention. As shown in FIG. 2, the transient voltage suppressor 100 comprises: a heavily doped substrate 10, a first doped layer 20, a second doped layer 22, a first heavily doped region 30, a second heavily doped region 32 and a plurality of trenches 40 disposed there in between for electrical isolation.

According to the embodiment of the present invention, the heavily doped substrate 10 is connected to a first node 12. The first doped layer 20 is formed on the heavily doped substrate 10, and the second doped layer 22 is further formed on the first doped layer 20. The first heavily doped region 30 and the second heavily doped region 32 are both formed in the second doped layer 22 and coupled to a second node 14 in common. The plurality of trenches 40 are arranged in the heavily doped substrate 10, having a depth not less than that of the first doped layer 20, wherein at least one of the trenches 40 is disposed between the first heavily doped region 30 and the second heavily doped region 32 for electrical isolation.

According to the embodiment of the present invention, the heavily doped substrate 10, the second doped layer 22, and the second heavily doped region 32 belong to a first conductivity type. On the other hand, the first doped layer 20 and the first heavily doped region 30 belong to a second conductivity type. The first conductivity type and the second conductivity type are opposite. For example, in one embodiment, when the first conductivity type is N type, the second conductivity type is P type. In other embodiment, when the first conductivity type is P type, the second conductivity type is N type. Those skilled in the art are allowed to make various modifications and variations to the present invention without departing from the scope or spirit of the invention, and still fall within the scope of the invention and its equivalent.

Figure 3:
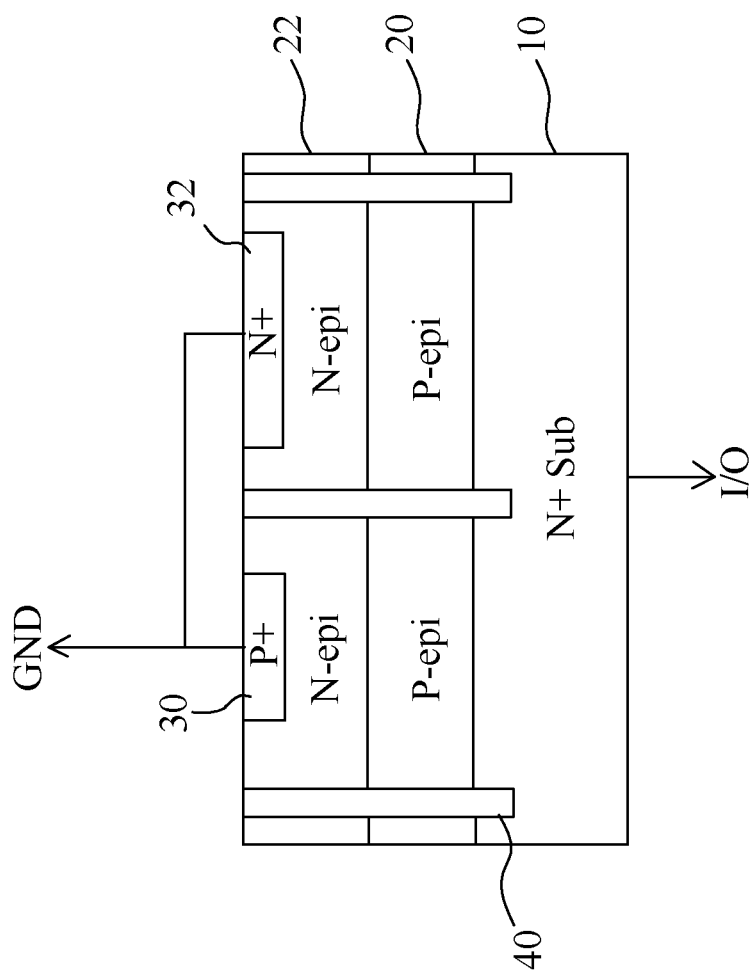
FIG. 3 shows a drawing of a transient voltage suppressor structure in accordance with a first preferable embodiment of the present invention.

In the following, the present invention discloses the two different conditions under the combination of the first conductivity type along with the second conductivity type. FIG. 3 shows a drawing of a transient voltage suppressor structure in accordance with a first preferable embodiment of the present invention, in which the first conductivity type is N type and the second conductivity type is P type. In such an embodiment, the heavily doped substrate 10 is a N+ substrate, the first doped layer 20 is a P type epitaxial layer, and the second doped layer 22 is a N type epitaxial layer. The first heavily doped region 30 is a P+ region, the second heavily doped region 32 is a N+ region, and both of the P+ region and the N+ region are coupled to ground GND in common. In other words, the first node 12 and the second node 14 in such an embodiment indicate as an I/O pin, and ground GND respectively.

Figure 4:
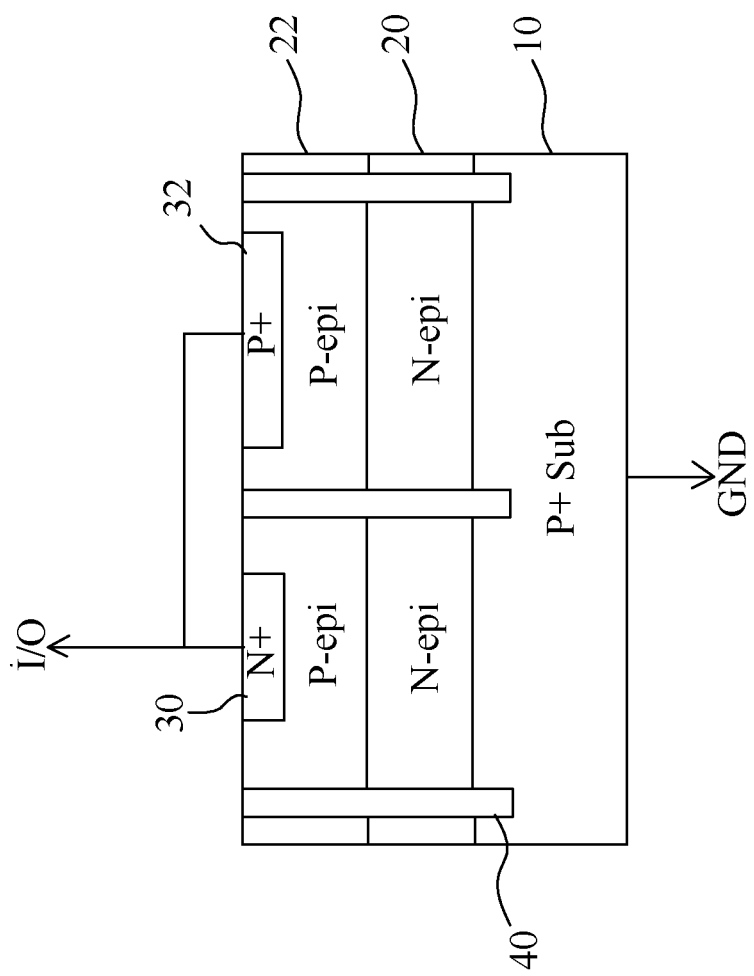
FIG. 4 shows a drawing of a transient voltage suppressor structure in accordance with a second preferable embodiment of the present invention.

FIG. 4 shows a drawing of a transient voltage suppressor structure in accordance with a second preferable embodiment of the present invention, in which the first conductivity type is P type and the second conductivity type is N type. In such an embodiment, the heavily doped substrate 10 is a P+ substrate, the first doped layer 20 is an N type epitaxial layer, and the second doped layer 22 is a P type epitaxial layer. The first heavily doped region 30 is a N+ region, the second heavily doped region 32 is a P+ region, and both of the N+ region and the P+ region are coupled to an I/O pin in common. In other words, the first node 12 and the second node 14 in such an embodiment indicate as ground GND and an I/O pin, respectively.

By such arrangements, it is apparent that the pn junctions of the transient voltage suppressor structure are not located at a surface of the device as the conventional ones, but being buried inside the device. As a result, since the pn junctions are controlled to be beneath the surface, its junction capacitance will not be as high as that of the conventional structures, and efficiency of the transient voltage suppressor structure can be well maintained.

In another aspect, it is worth noticing that the present invention is not limited thereto the above mentioned embodiments. Please refer to FIG. 5 and FIG. 6, which shows a drawing of a transient voltage suppressor structure in accordance with a third embodiment and a fourth embodiment of the present invention, respectively.

Figure 5:
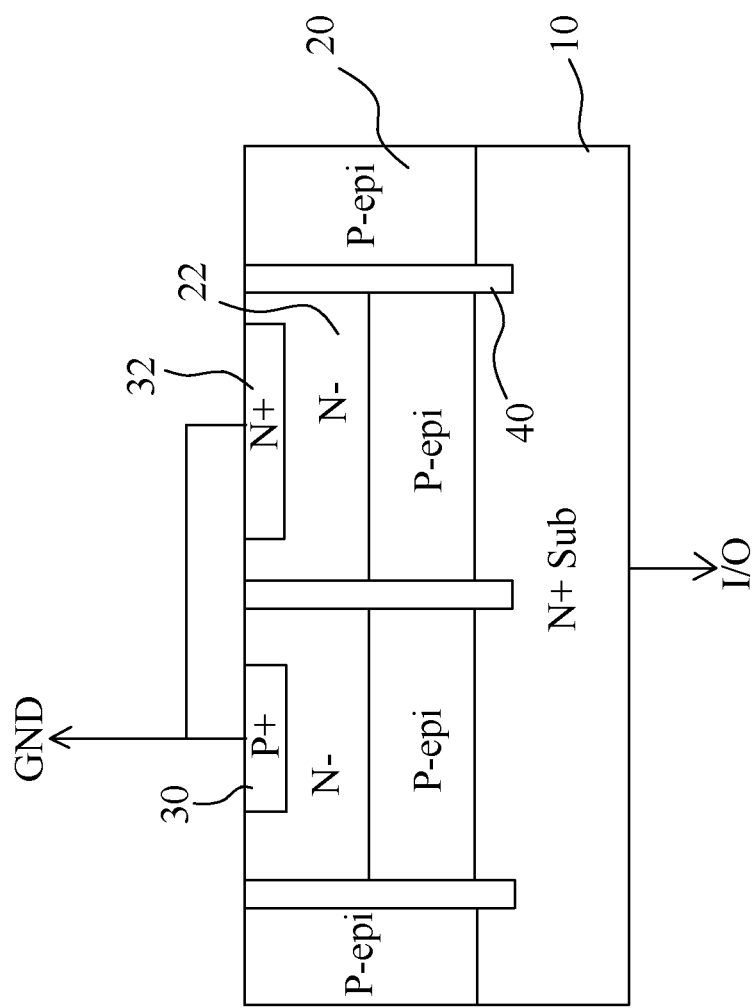
FIG. 5 shows a drawing of a transient voltage suppressor structure in accordance with a third preferable embodiment of the present invention.
Figure 6:
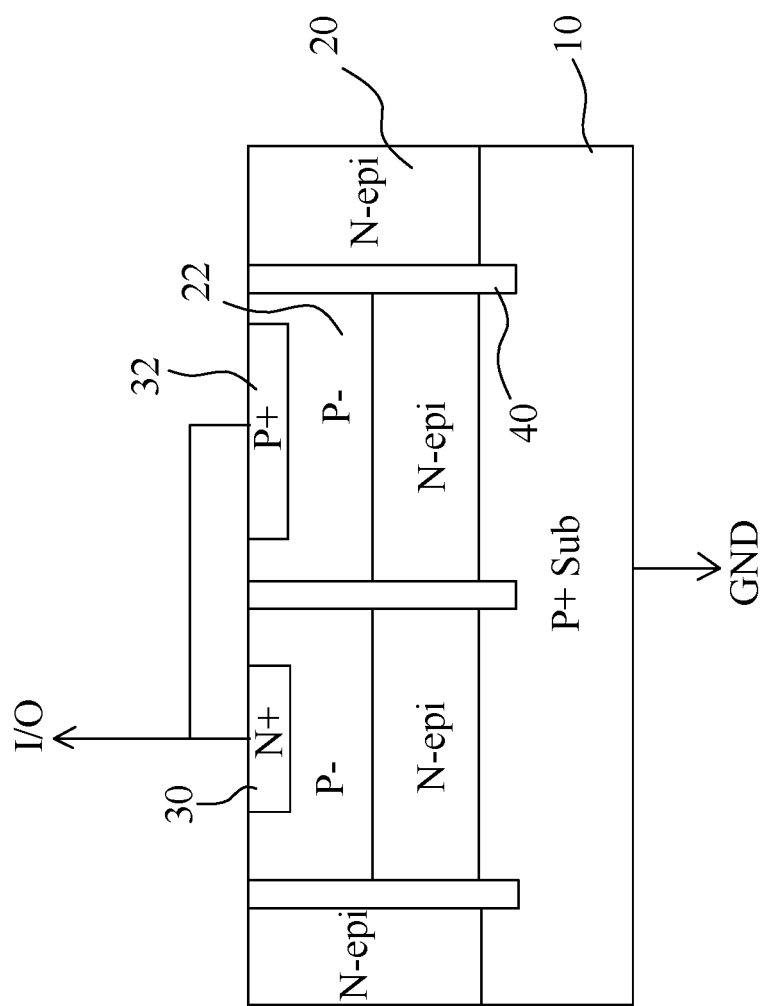
FIG. 6 shows a drawing of a transient voltage suppressor structure in accordance with a fourth preferable embodiment of the present invention.

FIG. 5 is a modification of the above proposed embodiment shown as FIG. 3. In FIG. 5, the second doped layer 22 can be alternatively an N type lightly doped well instead of a N type epitaxial layer (shown in FIG. 3). Similarly, FIG. 6 is a modification of the above proposed embodiment shown as FIG. 4, in which the second doped layer 22 can be alternatively a P type lightly doped well instead of a P type epitaxial layer (shown in FIG. 4). In such embodiments, the N type lightly doped well and/or the P type lightly doped well can be formed through an ion implantation technology. With different manufacturing processes, these two more variations shown in FIG. 5 and FIG. 6 are also able to be utilized so as to implement the objectives of the present invention without departing from the scope or spirit of the invention.

Figure 7:
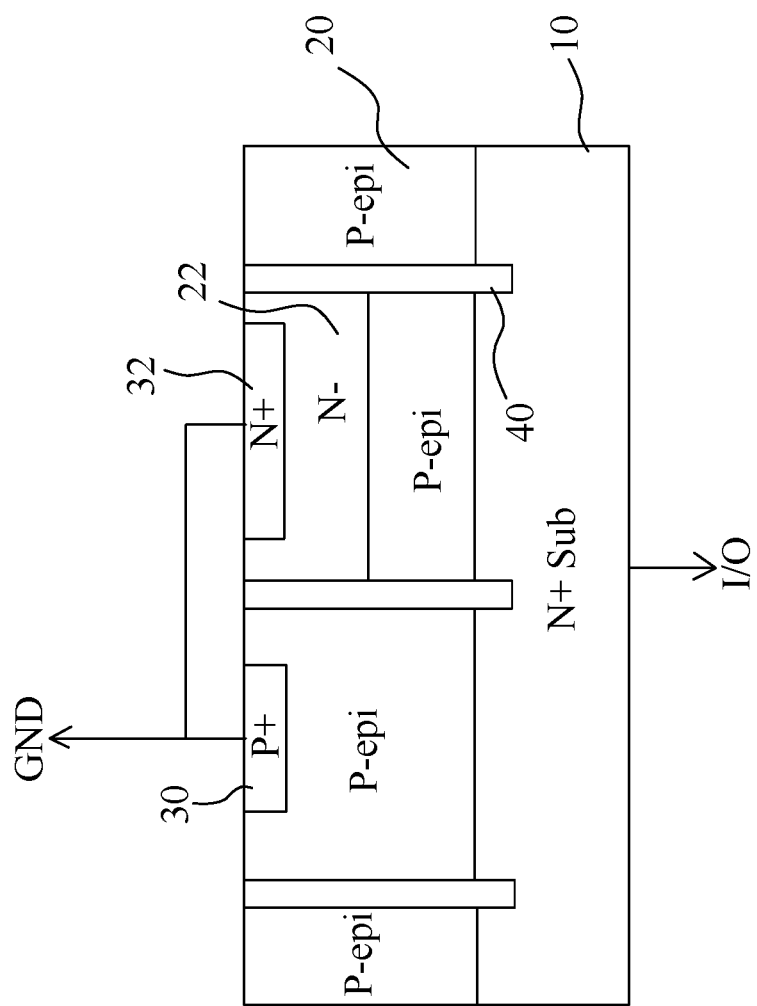
FIG. 7 shows a drawing of a transient voltage suppressor structure in accordance with a fifth preferable embodiment of the present invention.
Figure 8:
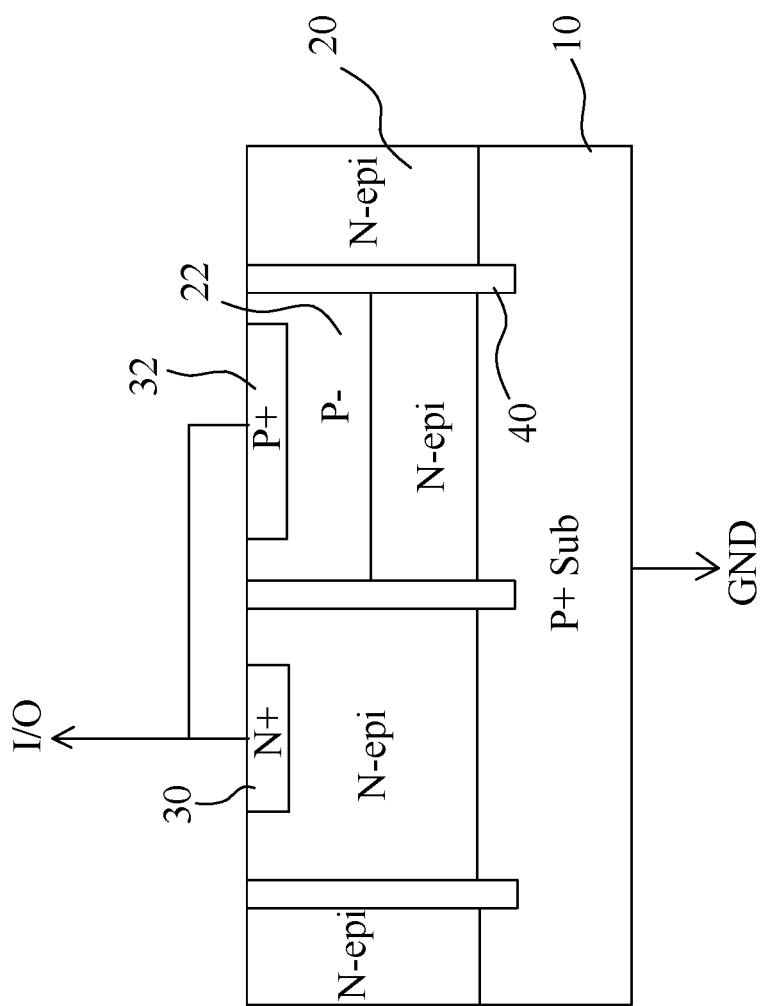
FIG. 8 shows a drawing of a transient voltage suppressor structure in accordance with a sixth preferable embodiment of the present invention.

Furthermore, FIG. 7 and FIG. 8 show two more modifications with respect to the earlier described FIG. 5 and FIG. 6, respectively. According to the present invention, FIG. 7 is a modification of the above proposed embodiment shown as FIG. 5. FIG. 8 is a modification of the above proposed embodiment shown as FIG. 6. The difference between the embodiments shown as FIG. 5 and FIG. 7 is that, the second doped layer 22 (i.e. the N type lightly doped well) in which the first heavily doped region 30 (i.e. the P+ regions) is formed can be alternatively removed such that the first heavily doped region 30 (i.e. the P+ regions) is formed directly in the first doped layer 20 (i.e. the P type epitaxial layer).

In the same manners, what makes the embodiments shown as FIG. 6 and FIG. 8 different is that, the second doped layer 22 (i.e. the P type lightly doped well) in which the first heavily doped region 30 (i.e. the N+ regions) is formed can be alternatively removed such that the first heavily doped region 30 (i.e. the N+ regions) is formed directly in the first doped layer 20 (i.e. the N type epitaxial layer). In other words, according to such embodiments of the present invention, the second doped layer 22 in which the first heavily doped region 30 is formed can be optionally disposed, and these embodiments are still able to be utilized so as to implement the objectives of the present invention without departing from the scope or spirit of the invention.

As a result, as compared to the prior design, it is believed that by such arrangements as the above mentioned embodiments the present invention has disclosed in FIGS. 2, 3, 4, 5, 6, 7, and 8, pn junctions of the transient voltage suppressor structure can be successfully controlled beneath the surface, thus solving the problems occurring in the prior design. In addition, the junction capacitance thereof is effectively decreased. Thus, the Applicants assert that the present invention is instinct, effective and highly competitive for incoming technology, industries and researches developed in the future and shall be patentable soon as well.

It will be apparent to those skilled in the art that various modifications and variations can be made to the present invention without departing from the scope or spirit of the invention. In view of the foregoing, it is intended that the present invention cover modifications and variations of this invention provided they fall within the scope of the invention and its equivalent.

What is claimed is:

1. A transient voltage suppressor, comprising:
    a heavily doped substrate of a first conductivity type, which is connected to a first node;
    a first doped layer of a second conductivity type, which is formed on said heavily doped substrate;
    a second doped layer of said first conductivity type, which is formed on said first doped layer of said second conductivity type;
    a first heavily doped region of said second conductivity type formed in said second doped layer and coupled to a second node;
    a second heavily doped region of said first conductivity type formed in said second doped layer and coupled to said second node; and
    a plurality of trenches arranged in said heavily doped substrate, having a depth not less than that of said first doped layer, wherein at least one of said plurality of trenches is disposed between said first heavily doped region and said second heavily doped region for electrical isolation, wherein when said first conductivity type is N type, said second conductivity type is P type, and said first node and said second node are coupled to an I/O pin and ground, respectively.

2. The transient voltage suppressor according to claim 1, wherein said first doped layer of said second conductivity type is a P type epitaxial layer.

3. The transient voltage suppressor according to claim 2, wherein said second doped layer of said first conductivity type is an N type epitaxial layer.

4. The transient voltage suppressor according to claim 2, wherein said second doped layer of said first conductivity type is an N type lightly doped well.

5. The transient voltage suppressor according to claim 4, wherein said second doped layer of said first conductivity type in which said first heavily doped region is formed can be alternatively removed such that said first heavily doped region is formed directly in said first doped layer of said second conductivity type.

6. A transient voltage suppressor, comprising:
    a heavily doped substrate of a first conductivity type, which is connected to a first node;
    a first doped layer of a second conductivity type, which is formed on said heavily doped substrate;
    a second doped layer of said first conductivity type, which is formed on said first doped layer of said second conductivity type;
    a first heavily doped region of said second conductivity type formed in said second doped layer and coupled to a second node;
    a second heavily doped region of said first conductivity type formed in said second doped layer and coupled to said second node; and
    a plurality of trenches arranged in said heavily doped substrate, having a depth not less than that of said first doped layer, wherein at least one of said plurality of trenches is disposed between said first heavily doped region and said second heavily doped region for electrical isolation, wherein when said first conductivity type is P type, said second conductivity type is N type, and said first node and said second node are coupled to ground and an I/O pin, respectively.

7. The transient voltage suppressor according to claim 6, wherein said first doped layer of said second conductivity type is an N type epitaxial layer.

8. The transient voltage suppressor according to claim 7, wherein said second doped layer of said first conductivity type is a P type epitaxial layer.

9. The transient voltage suppressor according to claim 7, wherein said second doped layer of said first conductivity type is a P type lightly doped well.

10. The transient voltage suppressor according to claim 9, wherein said second doped layer of said first conductivity type in which said first heavily doped region is formed can be alternatively removed such that said first heavily doped region is formed directly in said first doped layer of said second conductivity type.

\* \* \* \* \*